(12) United States Patent
Knoedgen

(10) Patent No.: US 8,994,290 B2
(45) Date of Patent: Mar. 31, 2015

(54) CIRCUIT AND LIGHTING SYSTEM FOR DIMMING AN ILLUMINANT

(75) Inventor: Horst Knoedgen, Munich (DE)

(73) Assignee: Tridonic GmbH and Co KG, Dornbirn (AT)

( * ) Notice: Subject to any disclaimer, the term of this patent is extended or adjusted under 35 U.S.C. 154(b) by 529 days.

(21) Appl. No.: 13/257,094

(22) PCT Filed: Mar. 18, 2010

(86) PCT No.: PCT/EP2010/053522
§ 371 (c)(1),
(2), (4) Date: Dec. 6, 2011

(87) PCT Pub. No.: WO2010/106128
PCT Pub. Date: Sep. 23, 2010

(65) Prior Publication Data
US 2012/0081037 A1    Apr. 5, 2012

(30) Foreign Application Priority Data

Mar. 19, 2009  (DE) .................. 10 2009 013 897

(51) Int. Cl.
*H05B 37/02*      (2006.01)
*H05B 41/392*     (2006.01)
*H03M 1/66*       (2006.01)

(52) U.S. Cl.
CPC ............. *H05B 41/392* (2013.01); *H03M 1/668* (2013.01); *H03M 1/664* (2013.01)
USPC ........ 315/297; 315/209 R; 315/291; 315/307; 315/308

(58) Field of Classification Search
USPC .............. 315/209 R, 224, 291, 297, 307, 308
See application file for complete search history.

(56) References Cited

U.S. PATENT DOCUMENTS

| | | | |
|---|---|---|---|
| 7,218,258 B2 | 5/2007 | Delanghe et al. | |
| 7,394,236 B2 | 7/2008 | Chapuis et al. | |
| 7,463,011 B2 | 12/2008 | Sharma | |
| 7,619,539 B2 | 11/2009 | Veskovic et al. | |
| 7,855,905 B2 | 12/2010 | Leung et al. | |
| 8,026,676 B2 * | 9/2011 | Liu et al. | 315/291 |
| 8,541,952 B2 * | 9/2013 | Darshan | 315/209 R |
| 2007/0188111 A1 * | 8/2007 | Taipale | 315/291 |
| 2008/0042632 A1 * | 2/2008 | Chapuis et al. | 323/283 |
| 2008/0224636 A1 * | 9/2008 | Melanson | 315/307 |
| 2010/0013393 A1 * | 1/2010 | Onishi et al. | 315/119 |

FOREIGN PATENT DOCUMENTS

| | | |
|---|---|---|
| CN | 102356698 | 2/2012 |
| DE | 10112114 | 10/2002 |

(Continued)

*Primary Examiner* — Douglas W Owens
*Assistant Examiner* — Thai Pham
(74) *Attorney, Agent, or Firm* — Lee & Hayes, PLLC

(57) ABSTRACT

Techniques for controlled dimming of an illuminant such as, for example, a light-emitting diode (LED), an organic light-emitting diode (OLED) or gas discharge lamp are described herein. In one example, a control difference formed by subtracting actual values from desired values (dimming values) is smaller than actual values fed back by the lamp. Thus, without directly digitizing an analog feedback variable, the example digitizes a control difference (control deviation) determined in the analog domain, in order to process the latter in a digital control algorithm that determines a digital manipulated variable that influences power to the illuminant.

19 Claims, 3 Drawing Sheets

(56) References Cited

FOREIGN PATENT DOCUMENTS

| DE | 102004056979 | 7/2005 |
| DE | 102009013897 | 9/2010 |
| DE | 102010002519 | 9/2010 |
| EP | 2409552 | 1/2012 |
| WO | WO02067636 | 8/2002 |
| WO | WO2007128528 | 11/2007 |
| WO | WO2010106128 | 9/2010 |

* cited by examiner

CIRCUIT AND LIGHTING SYSTEM FOR DIMMING AN ILLUMINANT

CROSS REFERENCE TO RELATED APPLICATIONS

This Application is a National Stage of International Application No. PCT/EP2010/53522, filed Mar. 18, 2010, which claims foreign priority to DE Application No. 10 2009 013 897.8, filed Mar. 19, 2009, both of which are incorporated herein by reference.

BACKGROUND OF THE INVENTION

The invention relates to a method for the controlled dimming of an illuminant such as, for example, an LED, OLEDs or gas discharge lamps in accordance with digital dimming values that form desired values.

Such a method is known and is, for example, embodied with the circuit arrangement according to the prior art as illustrated in FIG. 1. In the case of the known circuit arrangement, the illuminant is a gas discharge lamp 1. The latter is operated with a ballast 2 that is embodied in a known way, and for this reason only the important components are illustrated in schematic form. The ballast 2 contains two series-connected electronic switches S1, S2 that are supplied with a normal DC voltage. The two switches S1, S2 are controlled by a digital switching unit 3 that can change the switching frequency and/or the duty ratio. A series resonant circuit formed from an inductor L and a resonant capacitor C1 is located above the lower switch S2. The voltage drop across the resonant capacitor C1 is fed to the lamp 1 via a coupling capacitor C2. There is a resistor in the circuit of the lamp. The voltage drop across the resistor R1 is a measure of the luminous intensity produced by the lamp 1, and can therefore be used to form analog actual values $I_a$. The lamp 1 is dimmed via a digital control loop. Digital dimming values $D_d$ are made available via a DALI bus, for example, by a dimming value transmitter 4, which can be arranged in a remote control center. Digital dimming values can, for example, be formed by 12 or 13 bits in order to ensure as fine resolution of the dimming stages as possible. The abovementioned analog actual values $I_a$ are converted into digital actual values $I_d$ in an A/D converter 6. The digital dimming values $D_d$ and the digital actual values $I_d$ are compared with one another in a digital comparator 5. For the comparison, the A/D converter 6 should have as far as possible the same bit number as the digital dimming values $D_d$. A consequence of this in the case of a relatively high bit number of—as previously mentioned—12 or 13, for example, is that the A/D converter 6 operates relatively slowly. By means of the comparison of the digital dimming values $D_d$ and the digital actual values $I_d$, the digital comparator 5 produces a digital control deviation $X_d$ that is fed to a digital controller 7. The digital controller 7 produces therefrom a digital manipulated variable $X_d$ that is then fed to the digital switch unit 3.

Since, as previously mentioned, the A/D converter 6 is relatively slow, it operates in the range of milliseconds. Consequently, the entire control loop is relatively slow.

BRIEF SUMMARY OF THE INVENTION

It is the object of the invention to modify the method specified at the beginning to the effect that the requirements placed on the components used are reduced.

In particular, the requirements placed on the A/D converter are to be reduced.

The essential idea of the invention here is not directly to digitize an analog feedback variable, but to digitize a control difference (control deviation) determined in the analog domain, in order then to process the latter in a digital control algorithm that determines a digital manipulated variable that influences the power of the illuminant.

In accordance with the characterizing part of an embodiment, the object is achieved by virtue of the fact that desired dimming values (termed "dimming values") digitally prescribed for an operating device are firstly converted into analog dimming values, the analog dimming values are compared with corresponding analog actual values, and that an analog control deviation is determined therefrom, and in that the analog control deviation is then converted into a digital control deviation in order to carry out the digital control.

The invention is based on the finding that the control difference formed by subtracting the actual values from the desired values (dimming values) is smaller than the actual values led back by the lamp. When use is made of a PI controller, the control difference is even reduced to zero after settling. The relatively slight analog control deviation must admittedly subsequently be converted into a digital control deviation; the A/D converter required therefor can, however, have a reduced bit number. It therefore operates more quickly than the previous A/D converter with which the analog actual values have been converted into digital actual values. The entire control loop therefore also operates more quickly.

It is true that the inventive method requires the digital desired dimming values firstly to be converted into analog desired dimming values; the D/A converter required therefor is, however, not part of the control loop, and therefore does not influence the control rate thereof. According to the inventive embodiment, said control rate can lie in the range of microseconds.

Expedient developments of the inventive method are the subject matter of additional embodiments.

The invention further relates to a circuit arrangement for dimming an illuminant in accordance with digital dimming values—that form desired values—by digital control, having a comparator in which the dimming values and actual values corresponding to the brightness of the illuminant are fed, and that determines a control deviation by comparison, and having a digital controller to which the control deviation is fed, and that produces therefrom the analog manipulated variable for controlling the illuminant.

The abovedescribed circuit arrangement has already been mentioned as known at the beginning, and explained in conjunction with FIG. 1.

The tasks set for the circuit arrangement correspond to those of the inventive method.

Circuitry for performing the tasks set consists in the fact that connected upstream of the comparator is a D/A converter that converts the digital dimming values into analog dimming values, that the comparator operates in analog fashion and determines an analog control deviation, and that connected downstream of the comparator is an A/D converter that converts the analog control deviation into a digital control deviation that is then fed to the digital controller.

Expedient refinements of the inventive circuit arrangement are the subject matter of additional embodiments.

It may be remarked at this juncture that the content of the previously mentioned embodiments (not quoted) are to constitute part of the disclosure of the description.

Finally, the invention also relates to a lighting system.

Exemplary embodiments of the invention are described below with the aid of the drawings, in which:

DETAILED DESCRIPTION

Figure 1:
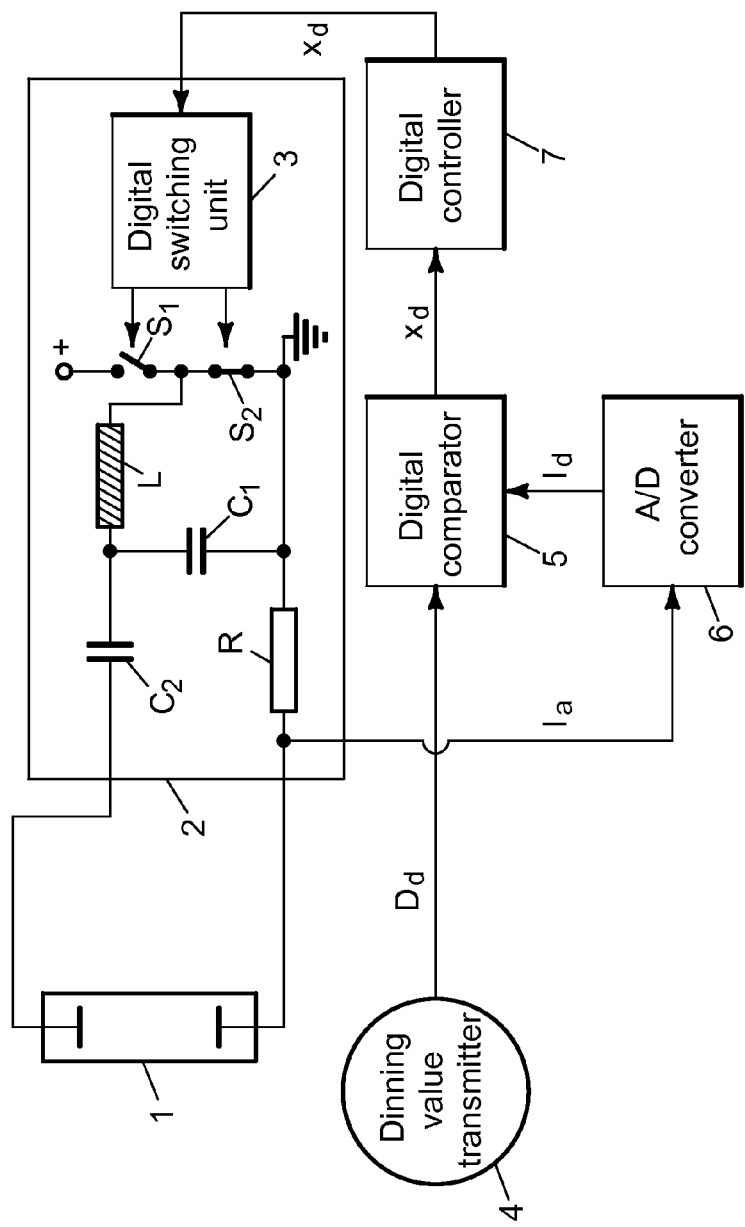
FIG. 1 shows a circuit arrangement according to the prior art.

The known circuit arrangement in accordance with FIG. 1 has already been explained at the beginning in conjunction with the description of the prior art.

Figure 2:
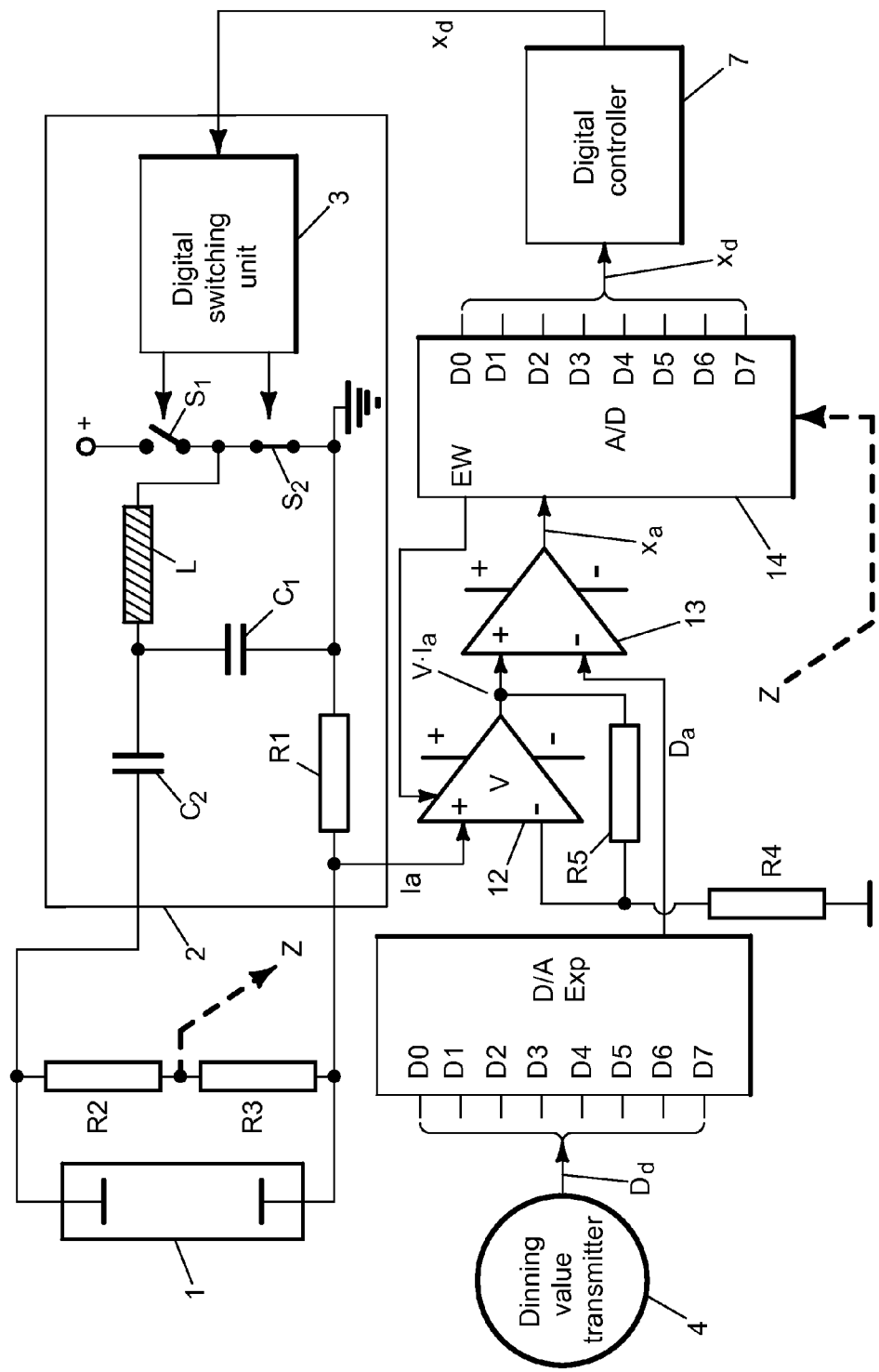
FIG. 2 shows an embodiment of the inventive circuit arrangement.

Components in FIG. 2 which are the same as those in FIG. 1 are denoted by the same reference symbols. Newly added components and blocks are presented in bold lines. The circuit arrangement according to FIG. 2 deviates from that of FIG. 1 initially in that the digital dimming values $D_d$ are converted into analog dimming values $D_a$ in a D/A converter 11. The particular properties of the D/A converter 11 will be explained later further in conjunction with FIGS. 3-5.

The analog dimming values $D_a$ are fed to the negative input of an analog comparator 13 formed by an operational amplifier. The analog actual values $I_a$ are fed to the positive input of an operational amplifier 12, which has a variable gain V. The negative input of the operational amplifier 12 is connected to frame via a resistor R4; however, it is connected to the output of the operational amplifier 12 via a feedback resistor R5. The analog actual value signals $V*I_a$ amplified by V are present at the output of the operational amplifier 12. They are fed to the positive input of the comparator 13. The comparator 13 forms the difference of its two input signals, and therefore produces the analog control deviation $X_a$. The latter is fed to an A/D converter 14. The A/D converter 14 produces from the analog control deviation $X_a$ a digital control deviation $X_d$ that is fed to the digital controller 7. The processing of the digital control deviation $X_d$ is then performed as in the case of the circuit arrangement according to FIG. 1.

It is important in the case of the circuit arrangement according to FIG. 2 that the digital dimming values $D_d$ are converted into analog dimming values $D_a$, and that the amplified analog actual values $V*I_a$ are compared with the analog dimming values $D_a$ in a comparator 13 operating in analog fashion, in order to produce the analog control deviation $X_a$, the latter then again being converted into a digital control deviation $X_d$ with the A/D converter. By comparison with FIG. 1, in the case of the circuit arrangement according to FIG. 2, the A/D converter 6 is thus omitted; in return, however, the D/A converter 11 and the A/D converter 14 are added. Despite this apparent complication, the circuit arrangement according to FIG. 2 has a decisive advantage, specifically that the control loop can operate more quickly. The A/D converter 14, which is part of the control loop, need only convert the relatively small analog control deviation $X_a$ into a digital control deviation $X_d$, and therefore manages with relatively few bits, for example 8 bits. This means that the control loop of the circuit arrangement in accordance with FIG. 2 operates more quickly than that of the circuit arrangement according to FIG. 1, in the case of which the A/D converter 6 must process a high bit number, specifically that which is prescribed, as a rule, with the digital dimming value $D_d$.

Figure 3:
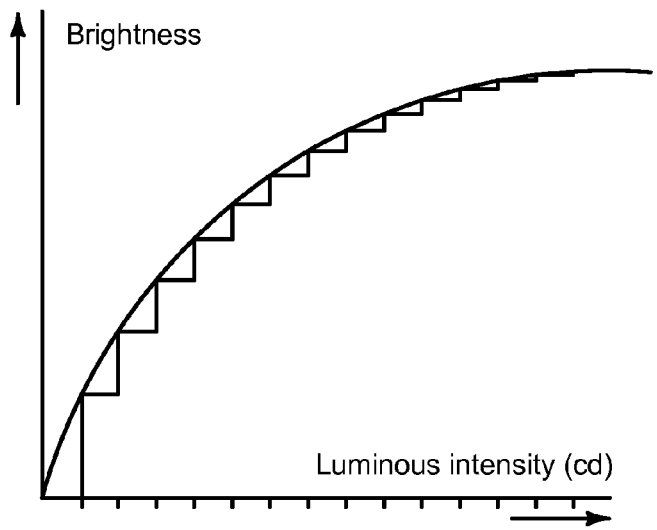
FIG. 3 shows the logarithmic dependence of the subjective perceived brightness on the physically measurable luminous intensity of the illuminant.
Figure 4:
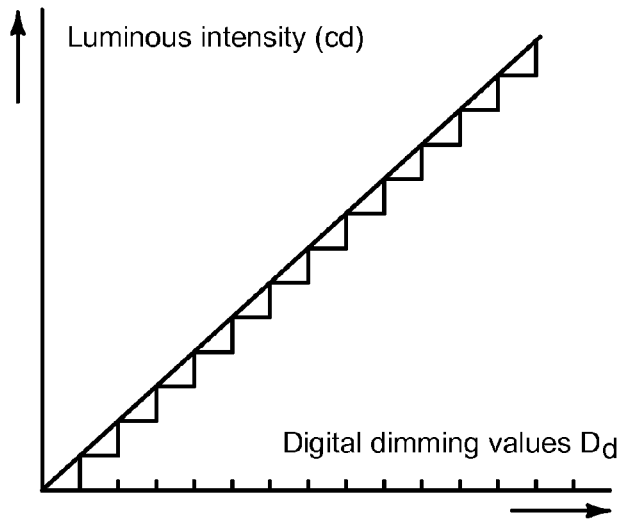
FIG. 4 shows the linear dependence of the luminous intensity on linearly digitized dimming values.
Figure 5:
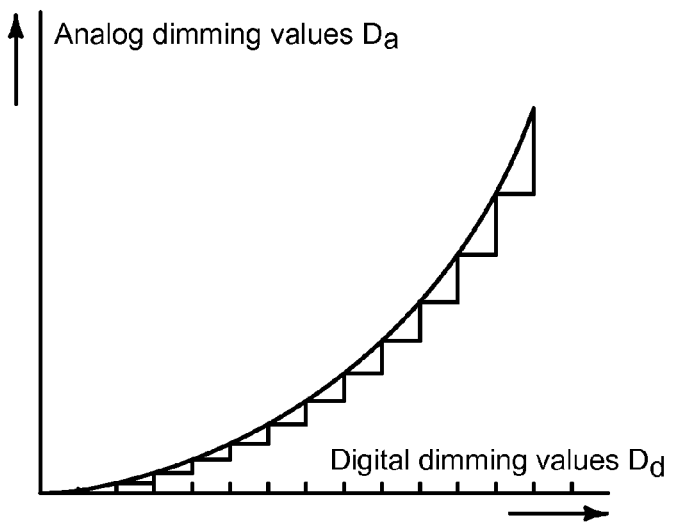
FIG. 5 shows the dependence of the analog dimming values on the digital dimming values with a targeted exponential distortion for the purpose of compensating the logarithmic curve in accordance with FIG. 1.

Reference is now made to FIGS. 3 to 5 in order to explain an additional function of the D/A converter 11.

FIG. 3 shows the known dependence of the subjectively perceived brightness of the luminous intensity—which can be measured physically in candelas—of an illuminant. It is to be seen that, in the case of relatively high luminous intensities, equidistant jumps in luminous intensity are still perceived only as small jumps in luminous intensity. In the case of low luminance intensities, by contrast, equidistant jumps in luminous intensity are perceived as correspondingly high jumps in brightness.

FIG. 4 shows the normal linear relationship between the luminous intensity produced by an illuminant, in particular by a gas discharge lamp, and linearly digitized dimming values $D_d$.

When the illuminant is controlled with equidistantly linearized dimming values $D_d$ in accordance with FIG. 4, the observer has the sensation of brightness in accordance with FIG. 3. The jumps in brightness differ in size in dependence on the luminous intensity. In order, nevertheless, to attain a brightness resolution that is satisfactory to a certain extent over the entire range of luminous intensity, the D/A converter 11 must have a relatively high bit number, for example 13 or 14 bits. This is certainly not a problem with regard to the reduced rate during dimming; all that is to be desired is rapid control. However, such a D/A converter is more expensive than a D/A converter with smaller bit number.

Use may be made of a D/A converter with a small bit number when one is chosen that additionally distorts exponentially, as is illustrated in FIG. 5. The distortion signifies that, for linearized digital dimming values $D_d$, analog dimming values $D_a$ are produced that are larger in the case of relatively high dimming values, and are smaller in the case of relatively low dimming values. In this way, the logarithmic curve in accordance with FIG. 3 is compensated by the exponential curve in accordance with FIG. 5.

Such an exponentially distorting D/A converter 11 is used in the case of the circuit arrangement in accordance with FIG. 2. It manages with 8 bits. Consequently, it also has 8 bit inputs. Such a distorting D/A converter is not mandatory, but advantageous for the reasons described. It is also possible to make use instead of a linearly converting D/A converter with a relatively high bit number which then, however, is—as mentioned—unfavorable in terms of cost.

As described above, the gain V of the operational amplifier 12 is variable. The gain V can be reduced when the A/D converter 14 reaches its extreme value, that is to say reaches its limit. In this case, the gain V of the operational amplifier 12 is reduced to half, for example. It is then necessary for the purpose of compensation to multiply the digital range in the A/D converter 14 by a factor of 2. The indication of reaching the extreme value EW is shown by the thick dotted line between the A/D converter 14 and the operational amplifier 12. The reduction in the gain V of the operational amplifier 12 is performed in practical terms by a factor that results from a binary combination, that is to say 2, 4, 8, etc. In order for the last mentioned function to be triggered, very high control deviations $X_a$ must occur, and it is necessary in this case to accept that the multiplication in a digital range entails a worsening of the resolution.

The reduction in the gain V of the operational amplifier 12 can also be triggered in the case of another operating state, for example whenever lamp 1 has been started, or shortly thereafter, when the control system has settled specifically. It is only then that a fine resolution is desirable. The possibility that the gain V is reduced when the lamp 1 is started is indicated in FIG. 2 by the thick dashed line, which leads to the A/D converter 14 from the node of a voltage divider R2/R3 situated over the lamp 1 via the path Z-Z. The signal voltage Z tapped from the voltage divider R1/R2 corresponds to the lamp voltage, which changes after the starting.

There is, furthermore, the possibility of transmitting to the operational amplifier 12 advanced information relating to an approaching relatively large jump in dimming. Furthermore, it is possible to modify the electronic ballast 2 such that it executes a large jump in dimming only when the operational amplifier 12 reduces its gain V, and the reduction by multiplication in the digital range in the A/D converter 14 has been compensated.

The invention claimed is:

1. A method for dimming an illuminant in accordance with digital dimming values that form desired values by digital control, comprising:
   converting the digital dimming values into analog dimming values,
   amplifying the analog actual values corresponding to a brightness of the illuminant,
   comparing the analog dimming values with corresponding analog actual values, and determining an analog control deviation therefrom, and
   converting the analog control deviation to a digital control deviation to carry out digital control.

2. The method as claimed in claim 1, wherein the amplifying of the analog actual values is reduced by a factor when a specific operating state is reached, and a multiplication by the factor is performed when the analog control deviation is converted to the digital control deviation to compensate for the reduction.

3. The method as claimed in claim 2, wherein the factor is 2 or an integral multiple thereof.

4. The method as claimed in claim 2, wherein the specific operating state is a reaching of a limit value in the converting, and/or if the illuminant is a gas discharge lamp, the starting of the gas discharge lamp.

5. The method as claimed in claim 1, wherein the converting the digital dimming values into the analog dimming values, the digital dimming values are modified such that dimming value steps are larger for high dimming values than for low dimming values.

6. An integrated circuit that is configured for dimming an illuminant in accordance with digital dimming values that form desired values by digital control, the circuit comprising:
   a digital to analog converter to convert the digital dimming values to analog dimming values,
   an amplifier to provide a gain to form amplified analog actual values,
   a comparator to compare the analog dimming values to the amplified analog actual values, and determine an analog control deviation therefrom, and
   an analog to digital converter to convert the analog control deviation to a digital control deviation to provide the digital control.

7. An operating device for illuminants comprising an integrated circuit as claimed in claim 6.

8. A lighting system comprising a plurality of operating devices with connected illuminants, including at least one operating device as claimed in claim 7.

9. The integrated circuit as claimed in claim 6, wherein the amplifier is a variable gain amplifier with the analog actual values fed to a positive input, and the analog dimming values fed to a negative input, of the amplifier.

10. A circuit arrangement for dimming an illuminant in accordance with digital dimming values which form desired values by digital control, comprising:
    an amplifier to provide a gain to form amplified analog actual values,
    a comparator in which analog dimming values and the amplified analog actual values corresponding to a brightness of the illuminant are fed, and that determines an analog control deviation by comparison, and the comparator operates in analog fashion to determine the analog control deviation,
    wherein connected upstream of the comparator is a digital to analog converter that converts the digital dimming values into the analog dimming values, and
    connected downstream of the comparator is an analog to digital converter that converts the analog control deviation into a digital control deviation that is then fed to a digital controller to produce an analog manipulated variable for controlling the illuminant.

11. The circuit arrangement as claimed in claim 10, wherein the amplified actual analog values are reduced by a factor when a specific operating state is reached, and a multiplication by the factor is performed when the analog control deviation is converted to the digital control deviation to compensate for the reduction.

12. The circuit arrangement as claimed in claim 11, wherein the factor is 2 or an integral multiple thereof.

13. The circuit arrangement as claimed in claim 11, wherein the specific operating state is a reaching of a limit value of the analog to digital converter, and/or if the illuminant is a gas discharge lamp, the starting of the gas discharge lamp.

14. The circuit arrangement as claimed in claim 10, wherein the digital to analog converter is designed such that during the conversion, the digital dimming values are modified such that dimming value steps are larger for high dimming values than for low dimming values.

15. The circuit arrangement as claimed in claim 10, wherein the amplifier is a variable gain amplifier with the analog actual values fed to a positive input, and the analog dimming values fed to a negative input, of the amplifier.

16. An operating device for illuminants comprising a circuit arrangement for dimming an illuminant in accordance with digital desired values by digital control, the circuit arrangement comprising;
    an amplifier to provide a gain to form amplified analog actual values,
    a comparator in which analog dimming values and the amplified analog actual values corresponding to a brightness of the illuminant are fed, and that determines an analog control deviation by comparison, and the comparator operates in analog fashion and determines an analog control deviation,
    a digital to analog converter connected upstream of the comparator that converts the digital dimming values into the analog dimming values, and
    an analog to digital converter connected downstream of the comparator that converts the analog control deviation into the digital control deviation that is fed to a digital controller to produce an analog manipulated variable for controlling the illuminant.

17. The operating device as claimed in claim 16, wherein the amplifier is a variable gain amplifier with the analog actual values fed to a positive input, and the analog dimming values fed to a negative input, of the amplifier.

18. A lighting system that includes a plurality of operating devices with connected illuminants, including at least one operating device having a circuit arrangement for dimming an illuminant in accordance with digital desired values by digital control, the circuit arrangement comprising:
- an amplifier to provide a gain to form amplified analog actual values,
- a comparator in which analog dimming values and the amplified analog actual values corresponding to a brightness of the illuminant are fed, the comparator determining an analog control deviation by comparison, and the comparator operates in analog fashion and determines an analog control deviation,
- a digital to analog converter connected upstream of the comparator that converts the digital dimming values into the analog dimming values, and
- an analog to digital converter connected downstream of the comparator that converts the analog control deviation into the digital control deviation that is fed to a digital controller to produce an analog manipulated variable for controlling the illuminant.

19. The lighting system as claimed in claim 18, wherein the operating devices are connected to a bus via which the desired dimming values are transmitted from a control center, a user interface or another bus device.

\* \* \* \* \*